Aug. 19, 1969 H. WEINSTEIN 3,462,654

ELECTRICALLY INSULATING-HEAT CONDUCTIVE MASS FOR SEMICONDUCTOR WAFERS

Filed Oct. 5, 1966

INVENTOR.
HAROLD WEINSTEIN

BY

OSTROLENK, FABER, GERB & SOFFEN
ATTORNEYS 3,462,654

ELECTRICALLY INSULATING-HEAT CONDUCTIVE MASS FOR SEMICONDUCTOR WAFERS

Harold Weinstein, Van Nuys, Calif., assignor to International Rectifier Corporation, El Segundo, Calif., a corporation of California Filed Oct. 5, 1966, Ser. No. 584,514
Int. Cl. H01b *3/00*
U.S. Cl. 317—234 1 Claim

ABSTRACT OF THE DISCLOSURE

A mass of beryllium oxide in particle form is embedded in a bonding material, such as a varnish, and adheres over the surface of a semiconductor device which has a junction terminating upon the surface. The mass of material serves as a heat sink for localized hot spots on the junction.

This invention relates to a novel heat exchange structure for semiconductor wafers having junctions terminating on the surface thereof, and more specifically relates to the use of a heat conductive but electrical insulation mass in intimate contact with a junction-containing surface of a semiconductor device.

The junction in a semiconductor wafer frequently terminates on an outer surface region of the wafer. It is well known in the art that localized current leakage paths across the junction at the surface will cause localized heating, or "hotspots," which lead to deterioration of the device. In the past, the heat generated by these localized current paths has been dissipated either through the semiconductor wafer, which is a poor heat conductor, or through insulating mediums surrounding the semiconductor wafer which are also poor heat conducting material.

The principal of the present invention is to contact the wafer surface receiving the junction termination with a mass of electrically insulating, but heat conductive material, whereby the heat generated at local regions of the junction due to the localized current paths, and the like, can be efficiently conducted away from these regions, thereby to substantially improve the aging characteristics of the device and to prevent the failure of the device. Such materials having the properties of electrical insulation, but good heat conductivity, are well known, and typically include beryllium oxide which is widely used because of its diverse thermal and electrical characteristics.

In accordance with the preferred embodiment of the invention, a body of beryllium oxide powder is suspended as a filler in varnish and a layer of varnish admixed with the beryllium oxide powder is coated over the junction-containing surface of the wafer. The varnish will serve as the means for securing the beryllium oxide mass in intimate surface contact with the wafer, thereby to permit efficient cooling of the wafer surface, including hot-spots on the junction, without electrically shortcircuiting the junction. Clearly, potting materials other than varnish can be used to support the beryllium oxide filler and, alternatively, a mass of beryllium oxide powder can be held in contact with the wafer surface by any suitable external housing arrangement.

Accordingly, a primary object of this invention is to cool localized hot-spots in a junction terminating on the surface of a semiconductor wafer.

Another object of this invention is to substantially diminish deterioration of semiconductor devices due to localized junction hot-spots.

Yet another object of this invention is to combine a semiconductor wafer having one or more junctions terminating on a surface thereof with a mass of an electrically insulating and thermally conductive material for cooling the wafer without electrically short-circuiting the wafer junctions.

These and other objects of this invention will become apparent from the following description when taken in connection with the drawings, in which.

Figure 1:
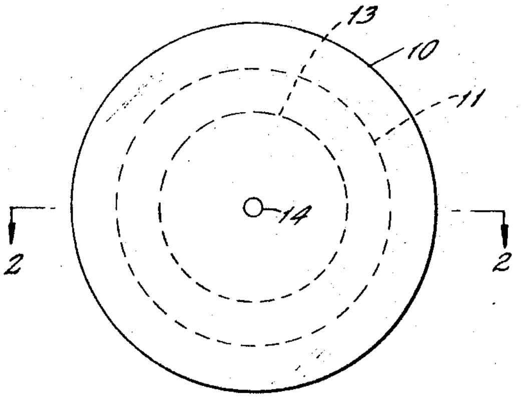
FIGURE 1 is a top view of a semiconductor wafer having an electrically insulating and thermally conducting mass extending across a junction terminating on the surface of the wafer.
Figure 2:
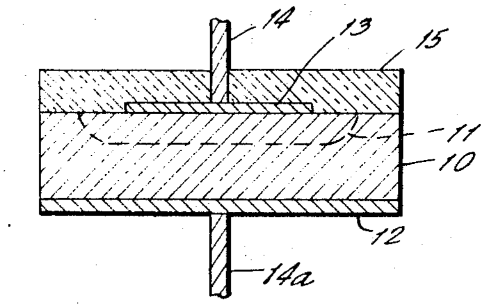
FIGURE 2 is a cross-sectional view of FIGURE 1 taken across the section line 2—2 in FIGURE 1.

Referring first to FIGURES 1 and 2, I have illustrated therein a semiconductor wafer 10 which can be of silicon and which has a P-N junction 11 therein which terminates on the surface of the wafer. A first electrode 12 having an extending lead **14*a* is connected to the bottom of the wafer while a second electrode 13 connected to an extending lead 14 is contained within junction 11**, as shown in FIGURE 2, with the assemblage defining a rectifier-type device.

In devices of this type, there frequently will be localized leakage current paths across the junction 11 at one or more discrete points along the closed line which defines the termination of the junction on the surface of the wafer, with this leakage current causing a hot-spot at these points.

In accordance with the present invention, uniform cooling is obtained over the full surface of the wafer including the closed line of junction 11 which extends to the surface by means of a mass 15 of beryllium oxide powder used as a filler in a varnish medium. Typically, 90 grams of beryllium oxide powder mixed with 10 grams of varnish can be coated over the wafer to a thickness of 20 mils, whereupon effective cooling of localized hot-spots will be obtained without affecting the electrical integrity of the junction 11. That is, the electrical insulation properties of mass 15 are high enough to prevent short-circuiting of the junction.

Alternative to the use of varnish as a carrying body for holding the beryllium oxide particles in thermal connection with the wafer surface, other settable materials could be used such as an epoxy material.

Figure 3:
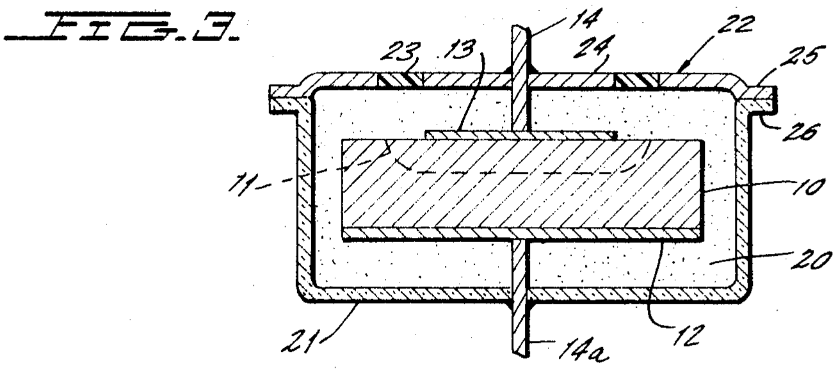
FIGURE 3 is a cross-sectional view similar to FIGURE 2 of a second embodiment of the invention.

While FIGURES 1 and 2 illustrate the use of a single mass 15 on the top surface of the wafer, it will be apparent that the electrically insulating, but thermally conductive mass, can be applied completely around the wafer to obtain uniform cooling thereof, particularly where the wafer may contain more than one junction. This type arrangement is illustrated in FIGURE 3 where the wafer 10 is similar in construction to the wafer of FIGURES 1 and 2, and contains the junction 11, electrodes 12 and 13 and the leads 14 and **14*a*. In order, however, to obtain improved thermal conductivity, the device of FIGURE 3 is adapted with means for elimnating a medium for carrying the beryllium oxide filler, and the wafer is packed directly into a pure beryllium powder mass 20. The beryllium oxide powder mass 20 is then carried in a lower metallic cup 21 which is soldered to lead 14*a* and is covered by a lid 22. Lid 22 has an insulation bead 23 inserted therein for preventing a continuous circuit through the housing from lead 14 and lead 14*a*. The interior metal disk 24 of lid 22 is then soldered to lead 14 while the flanges 25 and 26 of lid 22 and housing body 21, respectively, are suitably welded together to hermetically seal the enclosure and prevent the sifting of powder 20** from the enclosure.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. In combination, a semiconductor wafer and a mass of electrically insulating, thermally conductive material; said wafer of semiconductor material containing a junction therein; said junction terminating on the surface of said wafer in a closed line extending around said surface of said wafer; a first and second electrode; said first electrode connected to said wafer within the area enclosed by said closed line on said surface of said wafer; said second electrode connected to a portion of said surface of said wafer external of said closed line; said mass of said electrically insulating, thermally conductive material in contact with said surface of said wafer along at least said closed line termination of said junction; said mass consisting of an electrically insulating, thermally conductive material in particle form embedded in and distributed throughout a rigid binding medium; said binding medium mechanically adhering to said surface of said wafer; said mass having a thickness extending above said surface of said wafer which is greater than about 20 mils.

References Cited

UNITED STATES PATENTS

| | | | |
|---|---|---|---|
| 2,857,560 | 10/1958 | Schnable et al. | 317—235 |
| 2,887,628 | 5/1959 | Zierdt | 317—234 |
| 2,937,110 | 5/1960 | John | 117—200 |
| 2,967,984 | 1/1961 | Jamison | 317—234 |
| 3,030,560 | 4/1962 | Shearman | 317—234 |

FOREIGN PATENTS

| | | |
|---|---|---|
| 910,063 | 11/1962 | Great Britain. |

JOHN W. HUCKERT, Primary Examiner

R. F. POLISSACK, Assistant Examiner

U.S. Cl. X.R.

317—235